United States Patent
Schulz

Patent Number: 5,949,158
Date of Patent: Sep. 7, 1999

[54] METHOD AND ARRANGEMENT FOR CONTROLLING THE OUTPUT OF ELECTRICAL CONSUMERS CONNECTED TO AN AC LINE VOLTAGE

[75] Inventor: Detlef Schulz, Altenriet, Germany

[73] Assignee: Gerhard Kurz, Althengstett, Germany

[21] Appl. No.: 08/963,098

[22] Filed: Nov. 3, 1997

[30] Foreign Application Priority Data

May 5, 1997 [DE] Germany ............................ 197 18 814
May 5, 1997 [DE] Germany ....................... 297 07 902 U

[51] Int. Cl.$^6$ ...................................................... H02B 1/24
[52] U.S. Cl. ............................................. 307/127; 307/113
[58] Field of Search ................................... 307/127, 113, 307/135, 139, 146, 141, 111.4; 323/237, 238, 239, 300, 320, 265, 282

[56] References Cited

U.S. PATENT DOCUMENTS

| | | | |
|---|---|---|---|
| 4,772,809 | 9/1988 | Koga et al. | 307/140 |
| 4,933,798 | 6/1990 | Widmayer et al. | 361/18 |
| 5,528,131 | 6/1996 | Marty et al. | 323/901 |
| 5,783,876 | 7/1998 | Fazakas | 307/135 |

FOREIGN PATENT DOCUMENTS 33 03 126  8/1984  Germany.
43 27 070  4/1995  Germany.

*Primary Examiner*—Jeffrey A. Gaffin
*Assistant Examiner*—E. Garlepp
*Attorney, Agent, or Firm*—Cohen, Pontani, Lieberman, Pavane

[57] ABSTRACT

A method for controlling the output of electrical consumers connected to ac voltage, especially ohmic loads such as hot-plates, fans, hot-air blowers, electric heaters and the like, wherein an electric or electronic circuit component which conducts ac voltage in both directions, preferably a triac, is connected in series with the consumer, and the output control is effected at the consumer by the given angle of the phase control. An additional electric or electronic circuit component is arranged in parallel to the first series switching element, however, the additional component is controlled first so as to conduct in a controlled manner at the trigger time determined by the device control. The current flow of the additional component is substantially taken over by the first circuit component at the latest when reaching a predetermined threshold current through the load or a threshold voltage at the load or triac.

13 Claims, 2 Drawing Sheets

METHOD AND ARRANGEMENT FOR CONTROLLING THE OUTPUT OF ELECTRICAL CONSUMERS CONNECTED TO AN AC LINE VOLTAGE

BACKGROUND OF THE INVENTION

1. Field of the Invention

The invention relates to a method for controlling the output of electrical consumers connected to ac line voltage. The invention further relates to an arrangement for controlling the output of electrical consumers for carrying out this method.

2. Description of the Prior Art

Devices for controlling the output of electrical consumers which are connected to ac voltage, generally the line voltage, are known in a variety of forms and usually comprise a phase control circuit by which the firing angle of the electrical alternating quantity supplied to the consumer can be adjusted as desired, so that the supplied output can be regulated.

Phase control circuits of this kind are known, for example, from German reference DE 33 03 126 C2 which discloses a device for switch-on peak limiting in an engine control unit for the driving motor of a vacuum cleaner, which engine control unit is provided with a phase control circuit. Another example is disclosed in German reference DE 43 27 070 C1, which describes a device for regulating the power consumption of a vacuum cleaner. The ac voltage supplied to the electric motor driving the vacuum cleaner is regulated via a phase control circuit so that its value corresponds to the effective value of the motor voltage. The phase control circuits used for this purpose generally contain a triac which is connected to line voltage in series with the electrical consumer, in this case an electric motor, and supplies the electric motor with a discontinuous (sine) voltage depending upon the power desired.

Based on a circuit built from discrete components for the phase control, although the range of conceivable possibilities for realizing the circuit extends from optionally large-scale integration to a pure microprocessor control, the phase control in the trigger circuit for the triac comprises a resistor which is generally adjustable as a potentiometer or trimmer and a charging capacitor for firing the triac depending on the adjusted resistance. Thus, practically any desired intermediate outputs up to the full angle can be called up as desired by appropriate displacement of the firing angle.

However, a problem which always arises in phase control circuits of this kind, and which has recently come under increasing focus, is that even with comparatively small loads when these loads react ohmically, but also generally with increasingly higher possible maximum outputs of the electrical consumer (for the sake of clarity, the output of an electric heating device will be taken as an example hereinafter, although it is understood that the invention is applicable to any electrical consumer) there is a predetermined limit with respect to the harmonics generated overall by the consumer, including its control circuit. This limit can not be overcome in a simple manner.

In general, harmonics always occur in the absence of proportionality between the current and voltage. In the output control of an electric universal motor, harmonics are chiefly formed at first as odd-numbered harmonics which are derived in a first approximation from the quadratic dependency between current and voltage. But harmonics are also formed by, and in particular through, the phase control itself. These harmonics are moreover especially pronounced when the firing angle is approximately 90°, that is, when the permeability to current of the series triac is effected to some extent in the middle of the respective half wave as a result of corresponding firing.

Particularly when switching ohmic loads with triacs in ac line voltages, the short switching times of triacs which are commonly used today, result in very steep current increases which lead to considerable harmonic components as can be detected by Fourier analysis. The following numerical values can be taken as an exemplary point of departure, wherein it is understood that the invention is not limited by these values. Typical triac switching times of 5 $\mu$sec and load currents between 10 and 15 amperes, for example, result in current increases of more than 2.5 amperes/$\mu$sec. This causes high levels of interference precisely in the 100 to 300 kHz range, which levels already exceed permissible limits even with loads of only approximately 500 Watts.

Usually, such limits on the permissible harmonic content as mentioned above are determined by governmental regulations or will soon be incorporated in corresponding regulations. For example, the harmonic range is represented in Europe by the EMC or electromagnetic compatibility standard, as it is called, which to this extent also restricts the operation of ohmic loads in connection with phase controls.

SUMMARY OF THE INVENTION

The invention is based on the idea of decisively reducing the of the harmonics current level, by means of a retardation of the current increase in conventional phase controls.

Considered in themselves, the following possibilities, which are also known per se, can be offered in this instance in that correspondingly slow triacs are used, for example, although they are more difficult to manufacture from the point of view of semiconductor techniques and are also not currently available.

The installation of an inductance which could appreciably retard the corresponding current increases is also out of the question due to the high costs which are brought about, not only by the considerable mass of the required coils, but also due to the space requirement and weight of the inductance coils, since coil sizes of greater than 1 mH are required for currents up to approximately 16 amperes without the inductance going into saturation. Finally, a larger quantity of successive partial loads which are to be switched on one after the other can be used as a basis instead of an individual, switched ohmic load. However, this is also costly and requires much space, since a triac is required for every load, resulting in a correspondingly high assembly cost. Also, the use of filters and other shielding measures to keep the occurring harmonics away from the power supply is expensive and elaborate and turns out to be useful only for small loads.

Therefore, preceding from the insight mentioned above, the object of the present invention is to ensure in a phase control for electrical consumers, especially when these electrical consumers react as an ohmic load at low output, that the harmonics developing in the phase control remain within limits which are still acceptable and permissible.

Pursuant to this object, and others which will become apparent hereafter, one aspect of the present invention resides in a method for controlling the output of an electrical consumer connected to ac voltage, which method comprises the steps of connecting an electrical or an electronic first circuit component which conducts ac voltage in both directions in series with the consumer, affecting output control at the consumer by a given angle of phase control, arranging a second circuit component in parallel to the first circuit component, controlling the second circuit component first so as to conduct in a controlled manner at a triggered time determined by a control device, and substantially taking over current flow of the second circuit component by the first circuit component no later than upon reaching one of a predetermined threshold current through the consumer and a threshold voltage at one of the consumer and the first circuit component. Another aspect of the invention resides in an arrangement for controlling an output of an electric consumer connected to an ac line voltage, which arrangement includes a first circuit component which conducts ac voltage in both directions and is connected in series with the consumer, a second circuit component that conducts in both directions and is connected in parallel with the first circuit component, and means for controlling the first and second circuit components one after the other with a delay in time so that a leading edge of the supply current is conducted by the second circuit component until a given threshold value of the current through the consumer is reached, at which point the first circuit component is rendered conductive so that remaining current flow passes over the first circuit component until a decay of the half wave in question takes place. The method and arrangement according to the invention have the advantage that a reliable possibility is provided to considerably reduce the harmonic content generated by associated phase control circuits in electrical consumers, especially ohmic consumer output, and to keep it safely within predetermined or prescribed limits at a very slight additional expenditure on circuitry.

In so doing, there are no functional disadvantages in spite of the retarded current increase for reducing the harmonic content in practical use when using a phase control circuit of this kind. This is because at customary line frequencies, e.g., 50 or 60 Hz, to take numerical values as a basis, the duration of a half wave is 10 msec, while the controlled gradual switch-on current increase corresponding to the present invention is normally kept within the range of approximately 100 to 200 $\mu$sec. Although this is longer compared with the otherwise very steep edges of approximately 5 $\mu$sec for triac switch-on, namely, by an order of magnitude, it is not very significant compared with the total half wave period, especially also because it is possible to include the slower switch-on current increase in the time control parameters of the phase control circuit.

Normally, therefore, a phase control circuit according to the invention requires only one additional transistor which is arranged in its own control circuit so that, when first triggered (at this time the triac is still kept in its non-conductive state) leading edge of the load current rises until a maximum value or value value is reached, whereupon the triac is then also rendered conductive. The triac then takes over the load current in the respective half wave, namely, simply because of its lower saturation voltage compared with the transistor connected in parallel.

At this point, it is advisable to note immediately that the invention is not limited by the block diagram shown in the drawing which illustrates the invention by discrete switching stages or with respect to its operation or by the embodiment describing the invention in greater detail with reference to discrete circuit components. Rather, the block diagram and embodiment serve in particular to illustrate the functional basic actions of the invention and to indicate a possible mode of realizing special functional processes. It goes without saying that the individual building blocks, modules and discrete circuit components can be constructed in analog, digitally or also with hybrid techniques, or also can comprise or form, combined in their entirety or in part, corresponding areas of program-controlled digital systems, e.g., microprocessors, single-purpose computers, digital or analog logic circuits and the like. The description of the preferred embodiment of the invention indicated hereinafter is therefore to be understood only with respect to the functional overall operation and expiration of time, the manner of operation achieved by the respective blocks and circuit components, and with respect to the respective cooperation between the partial functions represented by the individual components. The individual circuit components are indicated only for the purpose of better comprehension and are not to be understood as limiting.

In another embodiment of the invention the transistor parallel to the triac is constructed as a Darlington transistor which is arranged parallel to the triac component via a diode bridge, and therefore so as to switch in both directions.

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

DETAILED DESCRIPTION OF THE PREFERRED EMBODIMENTS

The basic idea of the invention consists in utilizing a conventional electronic circuit component connected in parallel to the usual triac and having a retarded leading edge—when driven or with a purposely controlled current increase behavior to configure the switch-on current curve through the load so as to be retarded at first in a (monitored) controlled manner, specifically with a leading edge such that the generated harmonics content is still at an acceptable value depending, of course, on the application in question. Subsequently, that is, while preventing the steep current increase by the otherwise immediately controlled triac, the triac takes over the load current in its entirety or at least predominantly, wherein the parallel circuit component which leads in time with respect to its function can also be completely switched off. This parallel circuit component is advisably a correspondingly dimensioned power transistor which, although it requires additional space for its additional circuitry and its own control means, is nevertheless more advantageous than other solutions, while decisively reducing the harmonic component.

Figure 1:
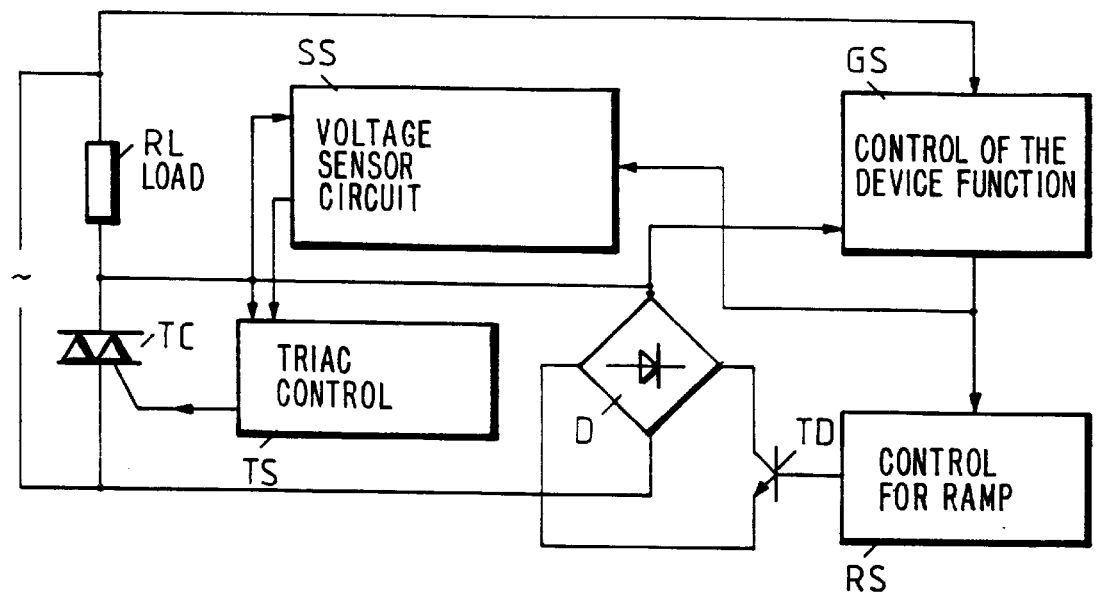
FIG. 1 shows, in the simplified form of a block diagram, the basic construction of an embodiment of a phase control circuit for an output control of a load connected to ac line voltage with effective reduction of harmonics, pursuant to the present invention.

In accordance with FIG. 1, a conventional basic control GS is provided for the device function. This basic control GS determines, normally on the basis of external defaults, that the load must be switched on at a predetermined angle of the supply voltage and then emits a corresponding trigger signal. This trigger signal is generated for every half wave at any location along the half wave. Thus, it can be effected earlier or later depending on the current to be supplied to the load RL.

In contrast to conventional phase control circuits, the trigger signal generated by the basic control GS starts a ramp gradually control RS, wherein a transistor TD following the generated ramp is switched on by the ramp in a controlled manner so that a leading edge results as time delay t at the desired trigger time of 100 to 200 μsec, for example, until the maximum current preset by the curve of the respective half wave is achieved by the load RL. The load current passes over a bridge rectifier D following the power transistor TD, wherein the power transistor TD lies in the transverse branch of the bridge. It can be seen that the bridge rectifier D lies parallel to the series triac TC for the load RL. Instead of the bridge rectifier D, it is also possible to use two transistors, each with a diode in series.

As was already mentioned previously, the control curve which is adapted in each instance to the utilized circuit components can be effected in any desired manner per se. Thus, it is possible to wait a predetermined time after starting the ramp, e.g., by running a counting circuit, until the series triac TC is triggered with its steep leading edge. But it is also possible to determine that the end current value is reached by means of an additional logic circuit, for which purpose a voltage sensor circuit SS is provided. This voltage sensor circuit SS detects the voltage drop at the triac TC and reacts as soon as a predetermined lower voltage limit is reached at the triac TC due to the presently conductive state of the power transistor TD. The voltage sensor circuit SS also receives the supplied trigger signal within the meaning of a logical AND operation with the firing of the triac TC via the triac control TS. Subsequently, the triac TC carries the load current for the remainder of the time, i.e., until the next half wave of the ac line voltage.

Figure 3:
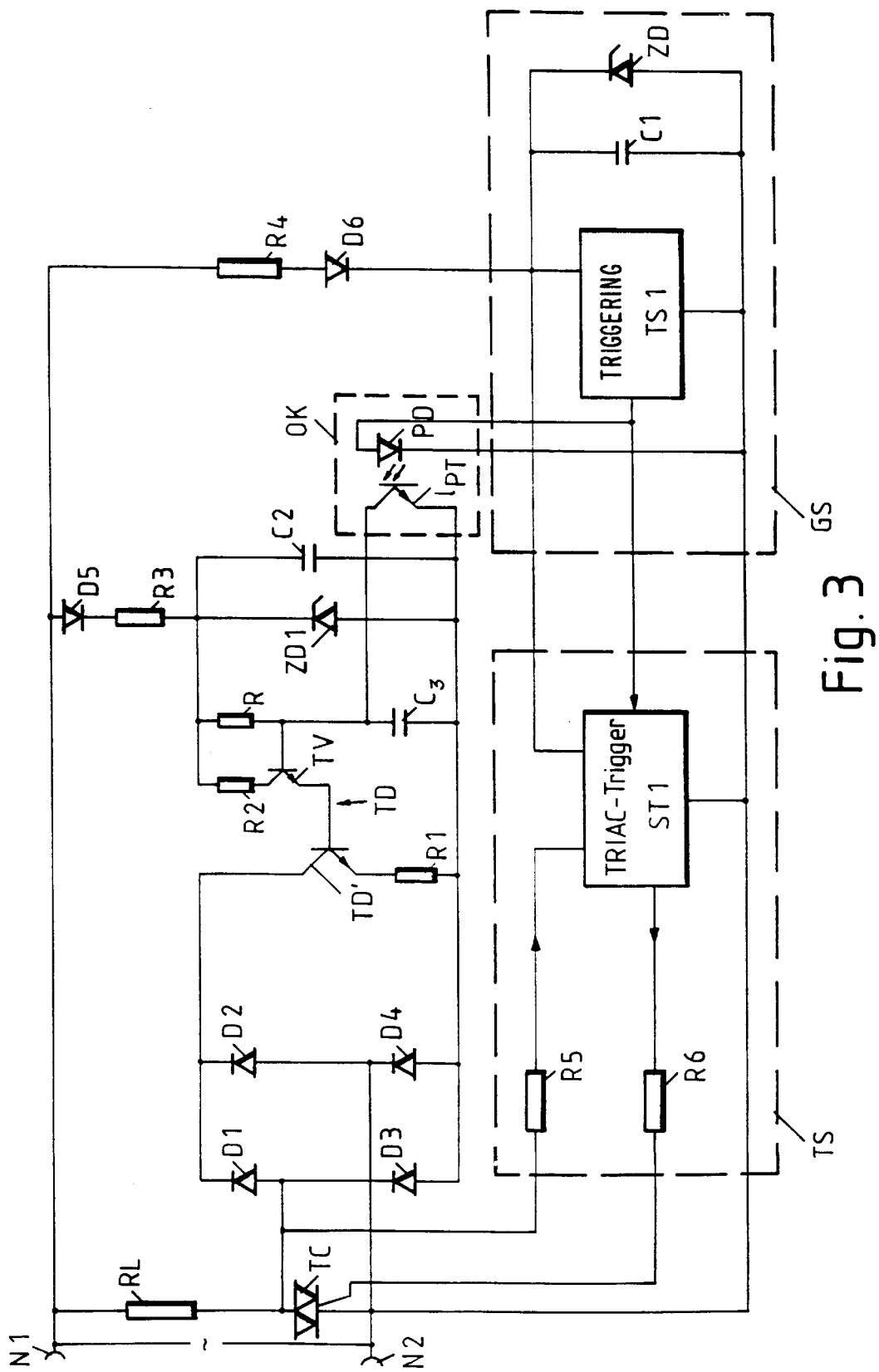
FIG. 3 is a detailed illustration showing an embodiment of the invention.

The basic control takes into account the fact that the two electric or electronic circuit elements connected in parallel with one another and in series with the load (in the illustrated embodiment the triac TC on the one hand and the parallel power transistor TD on the other hand) are connected to the load RL in sequence with respect to time in order, to give precedence at the triggering time to the circuit component whose leading edge is slower. The control is subject to a great many modifications and advantageous developments as is shown in particular by the embodiment shown in FIG. 3. Elements which are the same as those shown in FIG. 1 are provided with identical reference numbers. Comparable circuit blocks are shown with dashed borders and are likewise provided with the same reference numbers.

The preferred ohmic load RL is in series with the triac TC at the power supply input terminals N1, N2. The triac control TS comprises a bipolar Schmitt trigger ST1 with a preset switching voltage source, e.g., ±10 volts. The switching voltage value detected at the connection point between the load RL and the triac TC reaches the Schmitt trigger ST1 via the resistor R5. The triac TC is switched by the Schmitt trigger ST1 via the resistor R6, as will be discussed below.

Connected in parallel to the triac connection terminals is the diode rectifier circuit formed of the diode bridge D1, D2, D3, and D4, with a power transistor circuit TD in the transverse branch of the bridge. The power transistor circuit TD comprising a pre-transistor TV, with a resistor R2 at the collector, and a following Darlington transistor TD', with a resistor R1 in the emitter circuit. The basic control GS for the device function further comprises a trigger circuit TS1 with associated current supply elements of R4, D6, C1 and Zener diode ZD parallel to the trigger circuit TS1 which also supply the Schmitt trigger ST1 with current at the same time.

The following functions result. At the predetermined point in time, the trigger circuit TS1 generates the trigger signal and directs this trigger signal to an optocoupler OK formed of the photodiode PD and the phototransistor PT. As a result of the trigger signal, the phototransistor PT is switched to its non-conducting state, resulting in a charging circuit for the capacitor C3 in the control circuit for the pre-transistor TV in connection with the resistor R in the form of a RC network. The voltage supply from the line voltage is effected via the diode D5 in series with the resistor R3 and in parallel, via the Zener diode ZD1, with a capacitor C2 for stabilization.

This brings about a controlled current increase in the region of the power transistor TD, due to pre-transistor TV, wherein only a linear starting area (e.g., the first quarter of the curve of the voltage increase at the RC network) of the exponential voltage increase at the charging capacitor C3 is used. This causes the Darlington transistor TD' to be conductive, wherein the entire circuit acts as a controlled current source and ensures a continuous current increase via the diode bridge, which means, in other words, that a leading edge B of the current through the load RL results as a mirror image of the voltage increase across the capacitor C3 corresponding to the curve shown in FIG. 2.

Figure 2:
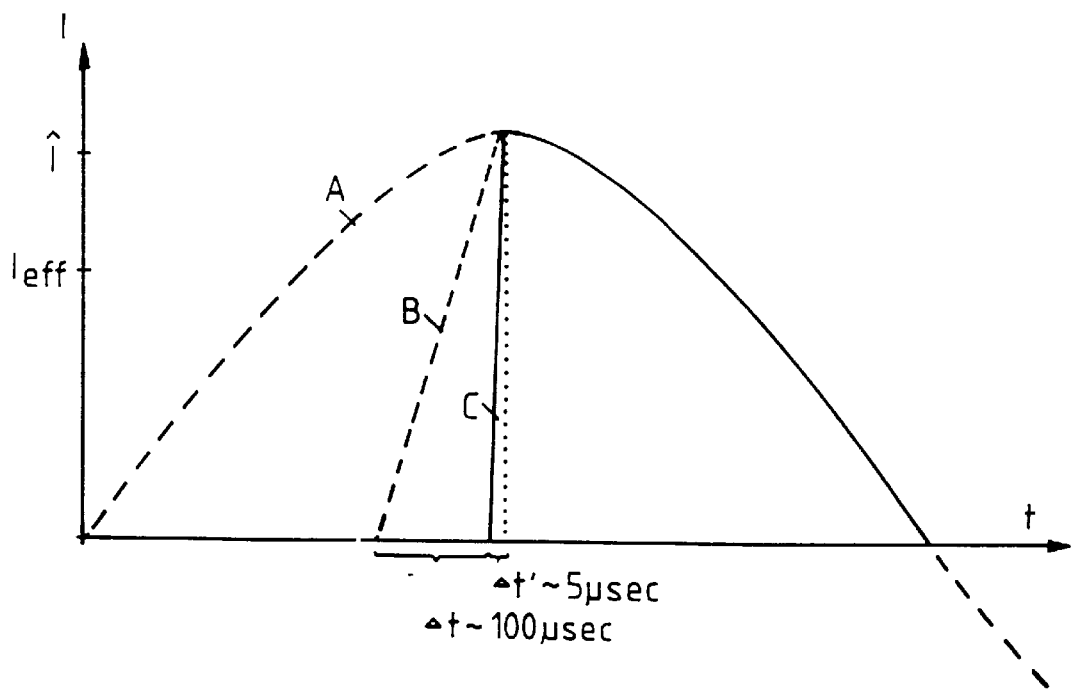
FIG. 2 is a diagram showing the time curve of the current controlled by the phase control and consumed by the consumer, wherein the different leading edges of the current increase can be seen.

In this connection, the current curves shown in FIG. 2 are understood as follows: current curve A corresponds, as is customary, to the following formula:

$$I = U_o . \sin \omega t / R \text{ and}$$

follows the line voltage;
current increase B corresponds to the controlled ramp, as was just explained, e.g., with $\Delta t \approx 100$ μsec, and current increase C results at the driving of the triac TC solely at $\Delta t' \approx 5$ μsec.

The continuous current increase as is given by prior triggering of the power transistor TD according to FIG. 2 (FIG. 2 shows the ratios, although naturally in a highly distorted form in a time ratio with respect to the line half wave for the sake of clarity) leads to a corresponding voltage drop across the non-conductive triac TC which is detected via the resistor R5 by the bipolar Schmitt trigger ST1 which therefore then directs its (following) trigger signal via resister R6 to the gate of the triac TC when the value drops below its threshold of, e.g., ±10 volts. At this point in time, the triac TC becomes conductive and completely takes over the load current due to its substantially lower saturation voltage (or lower internal resistance). In addition, however, there also comes about (in a useful manner) a switching off of the power transistor TD which is now only acted upon in parallel by low current in that (as is shown in the drawing) either the trigger signal of the Schmitt trigger ST1 for the triac TC is used at the same time for switching on the optocoupler OK again or in that, after the expiration of a given time period, the power transistor TD is switched off in a suitable manner, which results from the energy integral across the transistor so that the transistor is not overloaded.

The invention is not limited by the embodiments described above which are presented as examples only but can be modified in various ways within the scope of protection defined by the appended patent claims.

I claim:

1. A method for controlling power supply to an electrical consumer connected to ac voltage, comprising the steps of:
    connecting a first circuit component which conducts ac voltage in both directions in series with the consumer and power supply lines;
    arranging a second circuit component in parallel to the first circuit component, the second component having switching-on characteristics different from those of the first circuit component, including a controlled more gradual slope of a leading edge of current flowing through the component;
    effecting output control at the electrical consumer by a given angle of a phase control circuit, line voltage being supplied along a curve;
    controlling the second circuit component so as to first conduct in a controlled manner at a trigger time determined by a device control; and
    substantially taking over current flow of the second circuit component by the first circuit component no later than upon reaching one of a predetermined threshold current through the consumer and a threshold voltage at one of the consumer and the first circuit component, so that minimum harmonic interference voltages occur.

2. A method according to claim 1, wherein the first circuit component is a triac.

3. A method according to claim 1, including generating a trigger signal with the device control which causes a controlled rising current increase with a predetermined gradually increasing leading edge through the second circuit component and switching to the parallel first circuit component at the moment when a maximum value of load current is reached at the curve of supplying ac line voltage.

4. A method according to claim 3, including dimensioning a steepness of a leading edge of consumer current switched on at a phase control time in dependence on at least one of the load and trigger time.

5. A method according to claim 4, including dimensioning the steepness of the edge as a function of trigger time.

6. An arrangement for controlling power supply delivered to an electrical consumer connected to power supply lines of an ac line voltage, comprising: an electrical consumer; a first circuit component which conducts ac voltage in both directions connected in series with the consumer and the power supply lines; output control means for controlling the power supply to the consumer by a given angle of phase control; a second circuit component that conducts in both directions connected in parallel with the first circuit component, the second component having switching-on characteristics different from those of the first circuit component, including a controlled more gradual slope of a leading edge of current flowing through the component; and means for controlling and rendering conductive the first and second circuit components one after the other with a delay in time so that a leading edge of the supply current is conducted by the second circuit component, by rendering the second circuit component conductive before the first circuit component, until a given threshold value of the current through the consumer is reached, at which point the first circuit component is rendered conductive so that a remaining current of a respective half wave of the supply current is taken over by and flows through the first circuit component.

7. An arrangement according to claim 6, wherein the first circuit component is a triac.

8. An arrangement according to claim 6, wherein the second circuit component is a power transistor.

9. An arrangement according to claim 6, wherein the control means includes a base control operative to output a trigger signal, and a ramp control responsive to trigger signal of the base control, the to allow current flowing through the second circuit component to rise in a controlled manner with a predetermined leading edge until taking over the load current through the parallel first circuit component while forming a controlled current source.

10. An arrangement according to claim 9, wherein the ramp control includes a timing element in a control circuit of a pre-transistor to a following Darlington power transistor having outputs in a transverse branch of a rectifier-diode bridge which has another connection point connected with two connections of the first circuit component.

11. An arrangement according to claim 6, wherein the first circuit component is a triac, and further comprising voltage sensor circuit means for subsequent triggering the triac, the voltage sensor circuit means being operative to detect a voltage drop across the triac and trigger the triac to take over current through the consumer when falling below predetermined limiting values in both directions.

12. An arrangement according to claim 11, wherein the second circuit component is a power transistor, the control means being operative to block the power transistor no later than after an expiration of time depending on an energy integral across the power transistor after the triac takes over current.

13. An arrangement according to claim 12, wherein the means for controlling the triac includes a bipolar Schmitt trigger which is operative as of an AND element after the input of a trigger signal for driving the power transistor, to detect a subsequent drop in voltage below a threshold value at the triac in both switching directions and thereupon to generate a following trigger signal for the triac.

* * * * *